United States Patent
Wu et al.

(10) Patent No.: US 10,636,464 B1
(45) Date of Patent: Apr. 28, 2020

(54) MEMORY DEVICE

(71) Applicants: Jiangsu Advanced Memory Technology Co., Ltd., Jiangsu (CN); ALTO MEMORY TECHNOLOGY CORPORATION, Hsinchu County (TW)

(72) Inventors: Jui-Jen Wu, Hsinchu County (TW); Fan-Yi Jien, Hsinchu County (TW); Shen-Tsai Huang, Hsinchu County (TW); Junhua Zheng, Beijing (CN)

(73) Assignees: Jiangsu Advanced Memory Technology Co., Ltd., Jiangsu (CN); ALTO MEMORY TECHNOLOGY CORPORATION, Hsinchu County (TW)

( * ) Notice: Subject to any disclaimer, the term of this patent is extended or adjusted under 35 U.S.C. 154(b) by 0 days.

(21) Appl. No.: 16/365,655

(22) Filed: Mar. 26, 2019

(30) Foreign Application Priority Data

Dec. 25, 2018 (CN) .......................... 2018 1 1591546

(51) Int. Cl.
  *G11C 11/00* (2006.01)
  *G11C 13/00* (2006.01)
  *G11C 11/419* (2006.01)

(52) U.S. Cl.
  CPC .......... *G11C 11/00* (2013.01); *G11C 13/0004* (2013.01); *G11C 13/004* (2013.01); *G11C 13/0026* (2013.01); *G11C 13/0028* (2013.01); *G11C 13/0069* (2013.01); *G11C 11/419* (2013.01)

(58) Field of Classification Search
  CPC ... G11C 11/00; G11C 11/419; G11C 13/0004; G11C 13/004; G11C 13/0026; G11C 13/0069; G11C 13/0028
  See application file for complete search history.

(56) References Cited

U.S. PATENT DOCUMENTS

| | | | |
|---|---|---|---|
| 9,865,346 B1 * | 1/2018 | Perroni | G11C 13/004 |
| 2010/0259962 A1 * | 10/2010 | Yan | B82Y 10/00 365/51 |
| 2018/0308541 A1 * | 10/2018 | Liaw | G11C 11/419 |

* cited by examiner

*Primary Examiner* — Ajay Ojha
(74) *Attorney, Agent, or Firm* — CKC & Partners Co., LLC

(57) ABSTRACT

A memory device includes first and second memory arrays, first and second bit line driving circuits, first and second word line driving circuits, a read/write circuit, a controller, and first and second reference driving circuits. The first and second memory arrays include several memory units. The first and second bit line driving circuits are configured to interpret a memory bit address and drive a bit line. The first and second word line driver circuits are configured to interpret the memory word address and drive the word line. The read/write circuit is configured to read, set or reset the memory units. The controller is configured to switch the first and second memory arrays to work in a single memory unit mode or a dual memory unit mode. The first and second reference driving circuits are configured to drive reference rows.

10 Claims, 3 Drawing Sheets

MEMORY DEVICE

CROSS-REFERENCE TO RELATED APPLICATION

This application claims the priority benefit of Chinese Application serial no. 201811591546.3, filed Dec. 25, 2018, the full disclosure of which is incorporated herein by reference.

TECHNICAL FIELD

The present disclosure relates to a memory device. More particularly, the present disclosure relates to a phase change memory device.

DESCRIPTION OF RELATED ART

In memory technology, a resistive random-access memory includes a phase change memory (PCM), which can change a resistance value of a component by a crystal phase change of the material thereof, so as to store information by a change in resistance value. When the material in the memory element is crystalline, it exhibits a low resistance value, and conversely, when the material in the memory element is in an amorphous state, it exhibits a high resistance value, thereby storing data such as "1" or "0".

In the prior art, when reading the data of the memory unit in the memory device, the single memory unit is turned on, and the current corresponding to the single memory unit is compared with the reference current to determine whether a single data stored in the memory unit is "1" or "0". However, comparisons with current values may cause errors due to different bias voltages. Furthermore, the judgment of data reading with a single memory unit is liable to cause errors.

For details, reference is made to FIG. 1. In the prior art, a row decoding circuit (row decoder) and a column decoding circuit (column decoder) are located at a periphery of a cell array, and a read/write circuit (R/W circuit), which includes the sense amplifier circuit (sense amplifier) for reading the bit data, is located at a periphery of a column decoding circuit. When reading the resistive random-access memory component, the current of the memory element and the reference current are compared by the sense amplifier circuit to determine whether the information of the memory element is "1" or "0". Existing memory architectures include at least two major problems: (1) the reference circuit is located in the read/write circuit, in which typically a transistor is configured to generate the reference current. The position difference between the location of the transistor and the location of the memory cell is too large, and the magnitude of the currents generated at different positions of different memory cells are slightly different, which causes different noise margins for determining logic "1" or "0" of each cell and makes the optimization of memory performance be unreachable. The best memory effect is unable to produce. Furthermore, the reference current is generated by the transistor, but the current of the resistive random-access memory cell is determined by the effective resistance of memory cell. The process variation mechanism of the memory cell is different from that of the transistor, so the reference current cannot accurately adapt to the variation of the memory cell. (2) In the prior art, since the read/write circuit is located at the periphery of the column decoding circuit, when reading the memory unit, due to the loading effect of the bit line, the reading speed of the memory unit farthest from the reading circuit is the slowest. The pickup speed is the slowest, and the specification speed of the entire memory is decided by the slowest memory unit.

SUMMARY

An aspect of the present disclosure is to provide A memory device includes a first memory array, a second memory array, a first bit line driving circuit, a second bit line driving circuit, a first word line driving circuit, a second word line driving circuit, a read/write circuit, a controller, a first reference driving circuit, and a second reference driving circuit. The first memory array includes a plurality of first memory units. The second memory array includes a plurality of second memory units. The first bit line driving circuit is configured to interpret a first memory bit line address and to drive a first bit line. The second bit line driving circuit is configured to interpret a second memory bit line address and to drive a second bit line. The first word line driving circuit is configured to interpret a first memory word line address and to drive a first word line. The second word line driving circuit is configured to interpret a second memory word line address and to drive a second word line. The read/write circuit is coupled to the first bit line driving circuit and the second bit line driving circuit, and configured to read, write or reset the first memory units and the second memory units. The controller is configured to switch the first memory array and the second memory array to work in a single memory unit mode or a dual memory unit mode. The first reference driving circuit is configured to drive a first reference line, the reference line comprises a plurality of first reference units, and the first reference line and the first reference units are located in the first memory array. The second reference driving circuit is configured to drive a second reference line, the reference line comprises a plurality of second reference units, and the second reference line and the second reference units are located in the second memory array.

In sum, embodiments of this disclosure are to provide a memory device, and in particular, a phase change memory device. After the chip is completed, the user is still able to adopt single memory unit mode or dual memory unit mode according to his own needs. When the memory is operated in the single memory unit mode, the memory may obtain the maximum design capacity; in addition, since the reference current is generated by using the reference resistor, and the reference resistor is formed by the same material and process of the resistive random-access element, therefore, the process variation mechanism of the reference resistor is the same as that of the resistive random-access element of the memory unit. Therefore, the resistance variation of the resistive random-access element may be almost the same as the variation of the process, which results in more reading accuracy than the prior art. When operating in the dual memory unit mode, the data stored in the dual memory unit is read to determine whether the data stored in the memory unit is "1" or "0" so as to increase the accuracy of the data of the memory unit. The dual memory operation mode eliminates the loading effect of the memory unit, thus improving the reading speed of the memory.

BRIEF DESCRIPTION OF THE DRAWINGS

The present disclosure can be more fully understood by reading the following detailed description of the embodiment, with reference made to the accompanying drawings as follows.

DETAILED DESCRIPTION

In order to make the description of the disclosure more detailed and comprehensive, reference will now be made in detail to the accompanying drawings and the following embodiments. However, the provided embodiments are not used to limit the ranges covered by the present disclosure; orders of step description are not used to limit the execution sequence either. Any devices with equivalent effect through rearrangement are also covered by the present disclosure.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

In this document, the term "coupled" may also be termed as "electrically coupled," and the term "connected" may be termed as "electrically connected." "Coupled" and "connected" may also be used to indicate that two or more elements cooperate or interact with each other.

Figure 1:
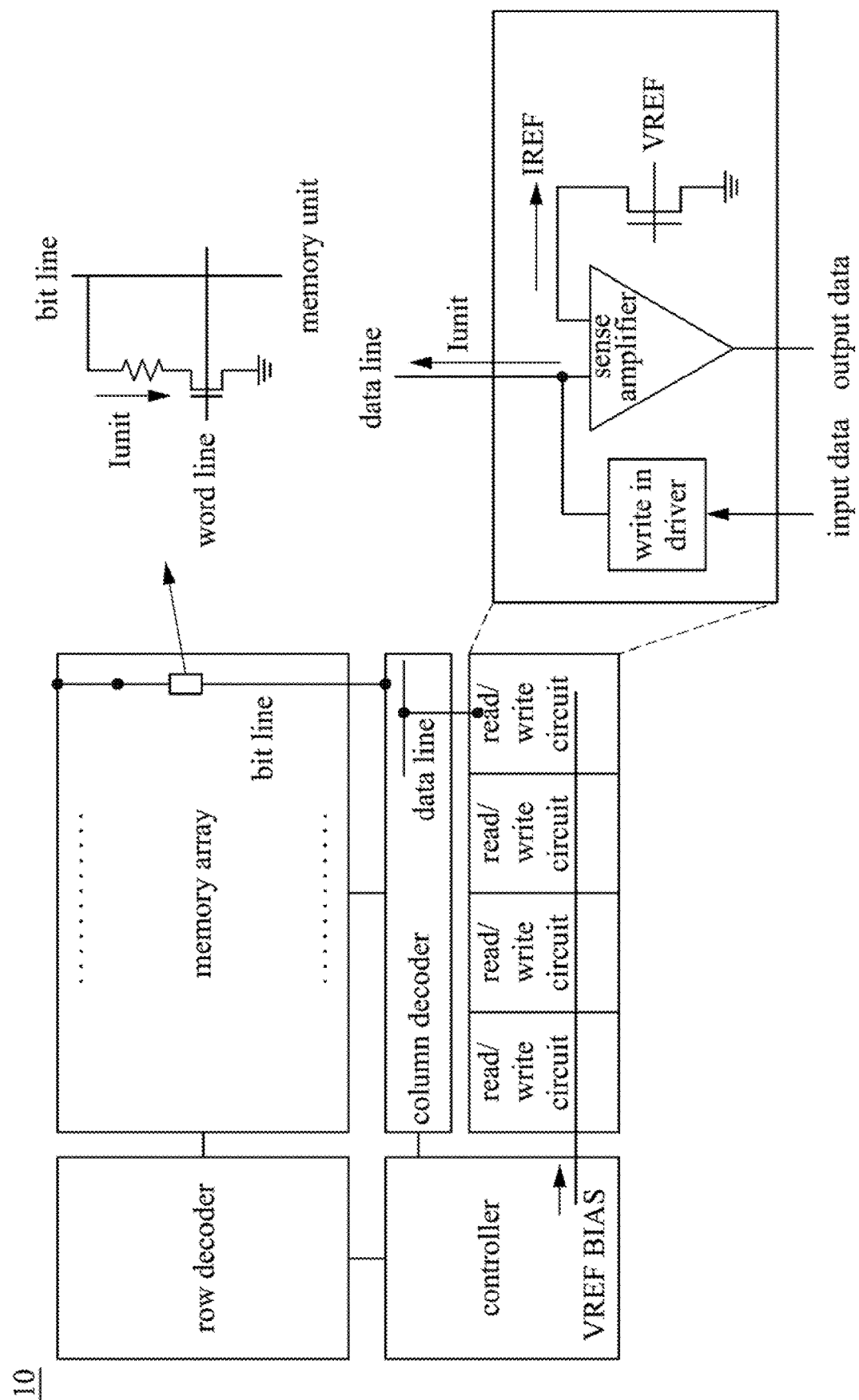
FIG. 1 is a current technology.
Figure 2:
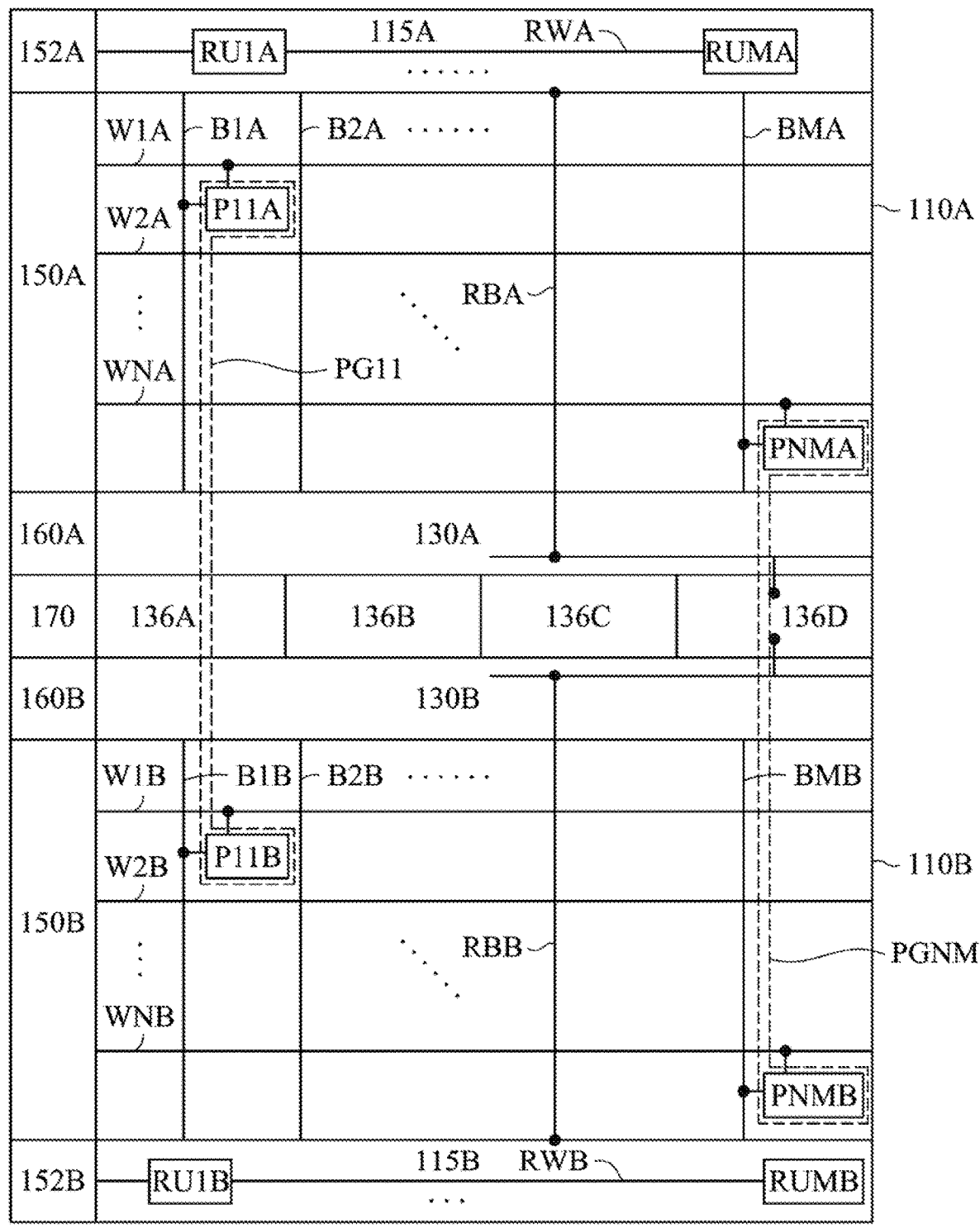
FIG. 2 is a schematic diagram of a memory device according to some embodiments of the present disclosure.

Reference is made to FIG. 2. FIG. 2 is a schematic diagram of a memory device 100 according to some embodiments of the present disclosure. Take phase change memory (PCM) for example, as illustrated in FIG. 2, the memory device 100 includes the memory arrays 110A, 110B, the bit line driving circuits 130A, 130B, the word line driving circuits 150A, 150B, the read/write circuits 136A to 136D, the interpret circuits 160A, 160B, and the controller 170. The memory array 110A includes several memory units P11A to PNMA, the memory array 110B includes several memory units P11B to PNMB.

In the connection configuration, the word line driving circuit 150A is coupled to several word lines W1A to WNA, the word line driving circuit 150B is coupled to several word lines W1B to WNB. The bit line driving circuit 130A is coupled to several bit lines B1A to BMA, and the bit line driving circuit 130B is coupled to several bit lines B1B to BMB. Each of the memory units P11A to PNMA couples to the word line driving circuit 150A through one of the word lines W1A to WNA, and each of the memory units P11A to PNMA couples to the bit line driving circuit 130A through one of the bit lines B1A to BMA. Each of the memory units P11B to PNMB couples to the word line driving circuit 150B through one of the word lines W1B to WNB, and each of the memory units P11B to PNMB couples to the bit line driving circuit 130B through one of the bit lines B1B to BMB.

The controller 170 couples to the interpret circuits 160A, 160B and the read/write circuits 136A to 136D. The read/write circuits 136A to 136D couple to the bit line driving circuits 130A, 130B. The interpret circuit 160A couples to the word line driving circuit 150A and the bit line driving circuit 130A, and the interpret circuit 160B couples to the word line driving circuit 150B and the bit line driving circuit 130B. The bit line driving circuit 130A couples to the reference line 115A through the reference bit line RBA, and the bit line driving circuit 130B couples to the reference line 115B through the reference bit line RBB.

The bit line driving circuit 130A is configured to decode the read and/or write addresses inputted to the memory units P11A to PNMA and to drive one of the bit lines B A to BMA, and the bit line driving circuit 130B is configured to decode the read and/or write address inputted to the memory units P11B to PNMB and to drive one of the bit lines B1B to BMB. The word line driving circuit 150A is configured to decode the read and/or write address inputted to the memory units P11A to PNMA and to drive one of the word lines W1A to WNA, and the word line driving circuit 150B is configured to decode the read and/or write address inputted to the memory units P11B to PNMB and to drive one of the word lines W1B to WNB.

The controller 170 is configured to distinguish the bit address from the word address inputted to the memory read write address, and to control the read/write circuit. The controller 170 is further configured to switch the memory arrays 110A, 110B to work in the single memory unit mode or in the dual memory unit mode. The read/write circuits 136A to 136D are configured to read, set or reset the memory units P11A to PNMA, P11B to PNMB.

Furthermore, the interpret circuit 160A is configured to interpret the word address and the bit address of the memory units P11A to PNMA. The interpret circuit 160B is configured to interpret the word address and the bit address of the memory units P11B to PNMB.

In some embodiments, the memory device 100 further includes the reference driving circuits 152A, 152B. The reference driving circuit 152A is coupled to the reference line 115A and is configured to drive the reference line 115A. The reference driving circuit 152B is coupled to the reference line 115B and is configured to drive the reference line 115B. The reference line 115A includes several reference units RU1A to RUMA. The reference line 115B includes several reference units RU1B to RUMB. In some embodiments, the reference line 115A and the reference units RU1A to RUMA are located in the memory array 110A, and the reference line 115B and the reference units RU1B to RUMB are located in the memory array 110B.

All of the memory units P11A to PNMA, P11B to PNMB include a memory element or a memory layer (not shown). The memory element or the memory layer are formed by specific material, in which the specific material may change its internal component status based on external operating conditions (for example: crystalline, amorphous, magnetic field, etc.) and includes different electrical properties. Thus, according to different electrical properties (for example: resistance, magnetoresistance, etc.). The memory units P11A to PNMA, P11B to PNMB store different data equivalently.

Furthermore, all of the reference units RU1A to RUMA and RU1B to RUMB include a reference element or a memory layer (not shown). The material and the structure of the reference elements or the memory layers are the same as the material and the structure of the memory elements mentioned above.

In some embodiments, the memory units P11A to PNMA, P11B to PNMB and the reference units RU1A to RUMA, RU1B to RUMB are phase change random access memory unit, in which the memory elements or the memory layers are realized by a material such as chalcogenide, but the embodiments or the present disclosure are not limited thereto. The memory layer includes different crystallization states at different operating temperatures to store different data equivalently.

The types of the memory units P11A to PNMA, P11B to PNMB, reference units RU1A to RUMA, RU1B to RUMB mentioning above are merely examples. Other forms of memory that can be used to implement the memory units P11A to PNMA, P11B to PNMB, reference units RU1A to RUMA, RU1B to RUMB, for example, such as variable resistance random access memory (ReRAM), magneto resistive random access memory (MRAM), etc., are within the scope of the embodiments of the present disclosure.

The memory device 100 in FIG. 2 is for illustrative purposes only, and the embodiments of the present disclosure are not limited thereto. For example, the number of the bit lines B1A to BMA, B1B to BMB, word lines W1A to WNA, W1B to WNB, memory units P11A to PNMA, P11B to PNMB and the reference units RU1A to RUMA, RU1B to RUMB are for illustrative purposes only, and the embodiments of the present disclosure are not limited thereto.

Furthermore, in FIG. 2, the reference line 115A is located at the top of the memory array 110A, and the reference line 115B is located at the bottom of the memory array 110B, but the embodiments of the present disclosure are not limited thereto. In some embodiments, the reference lines 115A, 115B can be respectively located at the top, the bottom or the middle of the memory array.

For ease of explanation, the following paragraphs are explained by implementing the memory units P11A to PNMA, P11B to PNMB by phase change memory units, but as described above, the memory units P11A to PNMA, P11B to PNMB of the present disclosure are not limited to phase change memory units.

In some embodiments, take the phase change memory as an example, when reading the memory units P11A to PNMA, P11B to PNMB, a read pulse is applied to the memory units P11A to PNMA, P11B to PNMB, and the current values of the memory units P11A to PNMA, P11B to PNMB are read so as to identify whether the stored data is data "1" or data "0".

Furthermore, if a reset pulse is applied to the memory units P11A to PNMA, P11B to PNMB, the operating voltage of the memory units P11A to PNMA, P11B to PNMB may increase rapidly. Therefore, the temperature of the phase change materials of the memory units P11A to PNMA, P11B to PNMB rise to the molten state accordingly, and then the operating voltage is rapidly dropped so that the phase change materials of the memory units P11A to PNMA, P11B to PNMB become amorphous. Under the condition, the memory units P11A to PNMA, P11B to PNMB are of high resistance.

On the other hand, if a set pulse is applied to the memory units P11A to PNMA, P11B to PNMB, the operating temperature of the memory layer of the memory units P11A to PNMA, P11B to PNMB exceeds a specific temperature within a certain period of time as the voltage of the set pulse rises. The set pulse set the state of the memory layer to be crystalline. Under the condition, the memory units P11A to PNMA, P11B to PNMB are of low resistance values.

In some embodiments, the data corresponding to the high resistance value is logic "1", and the data corresponding to the low resistance value is logic "0". In some other embodiments, the data corresponding to the high resistance value is logic "0", and the data corresponding to the low resistance value is logic "1".

In the embodiments of the present disclosure, the memory device 100 may be operated in the dual memory unit mode or the single memory unit mode. The dual memory unit mode refers to the mode of operation in which a data unit is stored in two memory units, as described in the previous paragraph. On the other hand, single memory unit mode refers to an operation mode in which a data is stored in a single memory unit, which will be described in the following paragraphs.

When the memory device 100 is operated in the dual memory unit mode, one of the memory units P11A to PNMA and one of the memory units P11B to PNMB form a memory unit group, which is configured to represent a data.

For example, as illustrated in FIG. 2, the memory unit P11A and the memory unit P11B form a memory unit group PG11, and the memory unit group PG11 is configured to represent a data. The memory unit PNMA and the memory unit PNMB form a memory unit group PGNM, and the memory unit group PGNM is configured to represent a data, and so on.

When the read/write circuits 136A to 136D read the data stored in each of the memory unit groups, the read/write circuits 136A to 136D determine the data stored in each of the memory unit groups according to the two memory units of each of the memory unit groups.

In dual memory unit mode, the read/write circuits 136A to 136D determine a data according to a value of one of the memory units P11A to PNMA and a value of one of the memory units P11B to PNMB.

In some embodiments, in the dual memory unit mode, the read/write circuits 136A to 136D read a value of one of the memory units P11A to PNMA through the bit line driving circuit 130A and read a value of one of the memory units P11B to PNMB through the bit line driving circuit 130B, so as to determine a data.

For example, the read/write circuits 136A to 136D read the value of the memory unit P11A through the bit line driving circuit 130A and read the value of the memory unit P11B through the bit line driving circuit 130B, so as to determine a data, and so on.

In some embodiments, the data stored in the two memory units of each of the memory unit groups are complementary to each other, and a memory unit group is configured to represent a memory data. For example, when the data corresponding to the resistance value of the memory unit P11A is 1, and the data corresponding to the resistance value of the memory unit P11B is 0, the read/write circuits 136A to 136D determine that the memory data of one of the memory unit groups PG11 to PGNM is 1. When the data corresponding to the resistance value of the memory unit P11A is 0, and the data corresponding to the resistance value of the memory unit P11B is 1, the read/write circuits 136A to 136D determine that the memory data of the one of the memory unit groups PG11 to PGNM is 0.

On the other hand, when the memory device 100 is operated in the single memory unit mode, each of the memory units P11A to PNMA, P11B to PNMB represents a data.

When the memory device 100 is operated in the single memory unit mode, the read/write circuits 136A to 136D determine a data according to a value of one of the memory units P11A to PNMA, P11B to PNMB and a value of one of the reference units RU1A to RUMA, RU1B to RUMB.

In details, when reading a value of one of the memory units P11A to PNMA of the memory array 110A, the read/write circuits 136A to 136D determine a data according to a value of one of the memory units P11A to PNMA and a value of one of the reference units RU1B to RUMB. On the other hand, when reading a value of one of the memory units P11B to PNMB of the memory array 110B, the read/write circuits 136A to 136D determine a data according to a value of one of the memory units P11B to PNMB and a value of one of the reference units RU1A to RUMA.

For example, the read/write circuits 136A to 136D determine a data according to a value of the memory unit P11A and a value of the reference unit RU1B. Or, the read/write circuits 136A to 136D determine a data according to a value of the memory unit P11B and a value of the reference unit RU1A.

In some embodiments, in the single memory unit mode, the read/write circuits 136A to 136D read a value of one of the memory units P11A to PNMA through the bit line driving circuit 130A and read a value of one of the reference units RU1B to RUMB through the bit line driving circuit 130B, so as to determine a data. Or, the read/write circuits 136A to 136D read a value of one of the memory units P11B to PNMB through the bit line driving circuit 130B and read a value of one of the reference units RU1A to RUMA through the bit line driving circuit 130A, so as to determine a data.

For example, in the single memory unit mode, when reading a value of the memory unit P11A, the read/write circuits 136A to 136D read a value of the memory unit P11A through the bit line driving circuit 130A and read a value of one of the reference units RU1B to RUMB through the bit line driving circuit 130B, so as to determine a data. On the other hand, when reading a value of the memory unit P11B, the read/write circuits 136A to 136D read a value of the memory unit P11B through the bit line driving circuit 130B and read a value of one of the reference units RU1A to RUMA through the bit line driving circuit 130A, so as to determine a data.

In some embodiments, the bit line driving circuits 130A, 130B respectively include several switches (not shown). When the memory device 100 is operated in the single memory unit mode, the several switches control the bit line driving circuit 130A to read a data of one from the bit lines B1A to BMA and control the bit line driving circuit 130B to read a reference data from one of the reference units RU1B to RUMB. Or, the several switches control the bit line driving circuit 130A to read the reference data from one of the reference units RU1A to RUMA and control the bit line driving circuit 130B to read a data from one of the bit lines B1B to BMB.

On the other hand, when the memory device 100 is operated in the dual memory unit mode, the several switches control the bit line driving circuit 130A to read a data from one of the bit lines B1A to BMA and control the bit line driving circuit 130B to read a data from one of the bit lines B1B to BMB.

Figure 3:
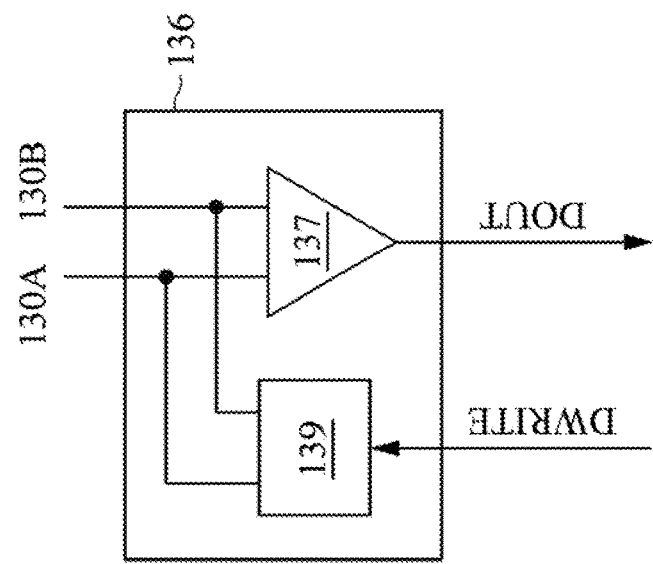
FIG. 3 is a schematic diagram of a read/write circuit in accordance with some embodiments of the present disclosure.

Reference is made to FIG. 3. FIG. 3 is a schematic diagram of a read/write circuit 136 in accordance with some embodiments of the present disclosure. The read/write circuit 136 is configured to represent the read/write circuits 136A to 136D in FIG. 2. As illustrated in FIG. 3, the read/write circuit 136 includes a sense amplifier 137 and a write-in driver 139.

The sense amplifier 137 is coupled to the bit line driving circuits 130A, 130B as illustrated in FIG. 2, and the sense amplifier 137 is configured to determine the memory data according to the data transmitted from the bit line driving circuits 130A, 130B. In details, the first input terminal of the sense amplifier 137 is configured to receive the data transmitted from the bit line driving circuit 130A, the second input terminal of the sense amplifier 137 is configured to receive the data transmitted from the bit line driving circuit 130B, and the output terminal of the sense amplifier 137 is configured to output the output data DOUT after the determination.

The write-in driver 139 is coupled to the bit line driving circuits 130A, 130B. In operation, the write-in driver 139 receives the write-in data DWRITE, and the write-in driver 139 writes the write-in data DWRITE to the memory units P11A to PNMA, P11B to PNMB through the bit line driving circuits 130A, and 130B.

In details, when the memory device 100 is operated in dual memory unit mode, the write-in driver 139 writes in data to the memory units P11A to PNMA through the bit line driving circuit 130A and writes in data to the memory units P11B to PNMB through the bit line driving circuit 130B.

In some embodiments, the data written into the two memory units of the same memory unit group are complementary to each other. For example, the data written into the memory unit P11A and the data written into the memory unit P11B are complementary to each other, so as to represent a data. That is, when the data written into the memory unit P11A is 0, the data written into the memory unit P11B is 1. On the contrary, when the data written into the memory unit P11A is 1, the data written into the memory unit P11B is 0.

It should be noted that, the sense amplifier 137 can determine the memory data according to the received current, voltage or resistance value.

Figure 4:
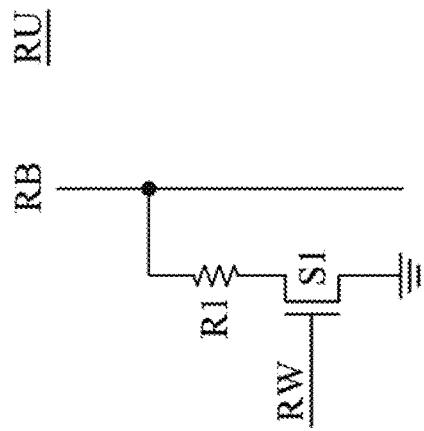
FIG. 4 is a reference unit in accordance with some embodiments of the present disclosure.

Reference is made to FIG. 4. FIG. 4 is a reference unit RU in accordance with some embodiments of the present disclosure. The reference unit RU as illustrated in FIG. 4 may be the reference units RU1A to RUMA, RU1B to RUMB as illustrated in FIG. 2.

The reference unit RU includes the resistor R1 and the switch S1. The resistor R1 may be the resistor formed by the set operation or the reset operation of the component of the memory layer in the reference units RU1 to RUM. The control terminal of the switch S1 is coupled to the reference word line RW as illustrated in FIG. 2. The reference word line RW may be the reference word line RWA or RWB as illustrated in FIG. 2. The first terminal of the switch S1 is connected to ground, the second terminal of the switch S1 is coupled to the first terminal of the resistor R1, and the second terminal of the resistor R1 is coupled to the reference bit line RB. The reference bit line RB may be the reference bit line RBA or RBB in FIG. 2.

Figure 5:
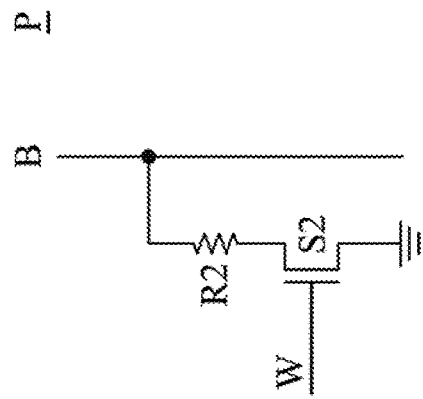
FIG. 5 is a memory unit in accordance with some embodiments of the present disclosure.

Reference is made to FIG. 5. FIG. 5 is a memory unit P in accordance with some embodiments of the present disclosure. The memory unit P as illustrated in FIG. 5 may be the memory units P11A to PNMA or P11B to PNMB in FIG. 2.

The memory unit P includes the resistor R2 and the switch S2. The resistor R2 may be the resistor formed by the set operation or the reset operation of the component of the memory layer of the memory units P11A to PNMA or P11B to PNMB. The control terminal of the switch S2 is coupled to the word line W. The first terminal of the switch S2 is connected to ground, the second terminal of the switch S2 is coupled to the first terminal of the resistor R2, and the second terminal of the resistor R2 is coupled to the bit line B. The word line W may be the word lines W1A to WNA, W1B to WNB in FIG. 2. The bit line B may be the bit lines B1A to BMA, B1B to BMB in FIG. 2.

Based on the aforementioned embodiments, the present disclosure provides a memory device, and in particular, a phase change memory device. By reading the data of the dual memory unit to determine whether the data stored in the memory unit is "1" or "0", the accuracy of the data of the memory unit is increased. Furthermore, in the embodiments of the present disclosure, the memory may be adjusted to the single memory operation mode as needed to increase the capacity of the memory device. That is, the user is able to adopt single memory unit mode or dual memory unit mode according to his own needs.

Although the present disclosure has been described in considerable detail with reference to certain embodiments thereof, other embodiments are possible. Therefore, the spirit and scope of the appended claims should not be limited to the description of the embodiments contained herein.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

It will be apparent to those skilled in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A memory device, comprising:
   a first memory array, comprising a plurality of first memory units;
   a second memory array, comprising a plurality of second memory units;
   a first bit line driving circuit, configured to interpret a first memory bit line address and to drive a first bit line;
   a second bit line driving circuit, configured to interpret a second memory bit line address and to drive a second bit line;
   a first word line driving circuit, configured to interpret a first memory word line address and to drive a first word line;
   a second word line driving circuit, configured to interpret a second memory word line address and to drive a second word line;
   a read/write circuit, coupled to the first bit line driving circuit and the second bit line driving circuit, and configured to read, set or reset the first memory units and the second memory units;
   a controller, configured to switch the first memory array and the second memory array to work in a single memory unit mode or a dual memory unit mode;
   a first reference driving circuit, configured to drive a first reference line, the first reference line comprises a plurality of first reference units, and the first reference line and the first reference units are located in the first memory array; and
   a second reference driving circuit, configured to drive a second reference line, the second reference line comprises a plurality of second reference units, and the second reference line and the second reference units are located in the second memory array.

2. The memory device of claim 1, wherein during the single memory unit mode, the read/write circuit determines a data according to a value of one of the first, the second memory units and a value of one of the first, the second reference units; in the dual memory unit mode, the read/write circuit determines another data according to a value of one of the first memory units and a value of one of the second memory units.

3. The memory device of claim 2, wherein during the single memory unit mode, the read/write circuit reads a value of one of the first memory units through the first word line driving circuit, and reads a value of one of the second reference units through the second word line driving circuit, so as to determine the data.

4. The memory device of claim 2, wherein during the dual memory unit mode, the read/write circuit reads a value of one of the first memory units through the first word line driving circuit and reads a value of one of the second memory units through the second word line driving circuit, so as to determine another data.

5. The memory device of claim 1, wherein the first reference line is located at the top, the bottom, or the middle of the first memory array, the second reference line is located at the top, the bottom, or the middle of the second memory array.

6. The memory device of claim 1, wherein the first bit line driving circuit, the second bit line driving circuit, and the read/write circuit are located between the first memory array and the second memory array.

7. The memory device of claim 3, wherein each of the first memory units and the second memory units comprises a memory element, each of the first reference units and the second reference units comprises a reference element, wherein a material and a structure of the reference element is the same as a material and a structure of the memory element.

8. The memory device of claim 7, wherein the memory element and the reference element are phase change memory elements.

9. The memory device of claim 7, wherein the read/write circuit further comprising:
   a sense amplifier, coupled to the first bit line driving circuit and the second bit line driving circuit and configured to determine a data; and
   a write in driver, configured to set or reset the memory element of the one of the first memory units and the second memory units or the reference element of one of the first reference units and the second reference units.

10. The memory device of claim 1, further comprising:
   a first interpret circuit, configured to interpret the first memory word line address and the first memory bit line address; and
   a second interpret circuit, configured to interpret the second memory word line address and the second memory bit line address.

* * * * *